US012757425B2

(12) United States Patent
Van Der Heijden et al.

(10) Patent No.: US 12,757,425 B2
(45) Date of Patent: Oct. 6, 2026

(54) CIRCUIT FOR TRANSPORTING CHARGED PARTICLES

(71) Applicants: QDEVIL APS, Copenhagen O (DK); UNIVERSITY OF COPENHAGEN, Copenhagen K. (DK)

(72) Inventors: Joost Van Der Heijden, Copenhagen O (DK); Ferdinand Kuemmeth, Copenhagen O (DK); Merlin Von Soosten, Copenhagen O (DK); Soren Andresen, Copenhagen O (DK); Jonatan Kutchinsky, Copenhagen O (DK); Anders Kuhle, Copenhagen O (DK)

(73) Assignees: QDEVIL APS, Copenhagen (DK); UNIVERSITY OF COPENHAGEN, Copenhagen (DK)

( * ) Notice: Subject to any disclaimer, the term of this patent is extended or adjusted under 35 U.S.C. 154(b) by 0 days.

(21) Appl. No.: 18/683,392

(22) PCT Filed: Aug. 15, 2022

(86) PCT No.: PCT/EP2022/072759
§ 371 (c)(1),
(2) Date: Feb. 13, 2024

(87) PCT Pub. No.: WO2023/017186
PCT Pub. Date: Feb. 16, 2023

(65) Prior Publication Data

US 2024/0371991 A1 Nov. 7, 2024

(30) Foreign Application Priority Data

Aug. 13, 2021 (EP) .................................... 21191231

(51) Int. Cl.
*G11C 11/00* (2006.01)
*G06N 10/40* (2022.01)
*H10D 30/47* (2025.01)

(52) U.S. Cl.
CPC ........... *H10D 30/473* (2025.01); *G06N 10/40* (2022.01)

(58) Field of Classification Search
CPC ............................. G06N 10/40; H10D 30/473
See application file for complete search history.

(56) References Cited

U.S. PATENT DOCUMENTS

2014/0319367 A1* 10/2014 Muraki ............... H01J 37/3177 250/397
2020/0118791 A1* 4/2020 Teguri ................ H01J 37/3177
(Continued)

FOREIGN PATENT DOCUMENTS

WO 2004015545 A2 2/2004
WO 2020084489 A1 4/2020

OTHER PUBLICATIONS

Averin et al., "Coulomb blockade of single-electron tunneling, and coherent oscillations in small tunnel junctions", Journal of Low Temperature Physics, vol. 62, Nos. 3/4, as early as Feb. 1, 1986, pp. 345-373.
(Continued)

*Primary Examiner* — Pho M Luu
(74) *Attorney, Agent, or Firm* — Workman Nydegger

(57) ABSTRACT

A circuit for transferring charge, which may be in the form of charged particles from a first storage element to one of a plurality of second storage elements, the circuit comprising a circuit element configured to receive the charge or charged particles and deliver the charge or charged particles to an identified one of the plurality of second storage elements. The charge delivered may be the same charged particles or
(Continued)

Figure 1:
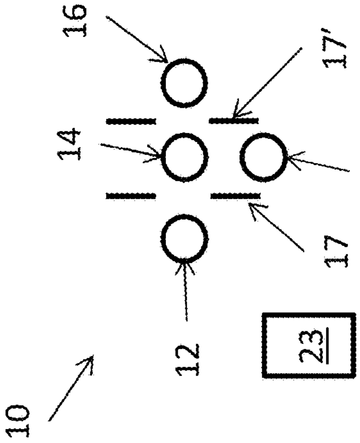

other charged particles. The circuit may be used for embodying Boolean circuits or gates operable at cryo temperatures.

15 Claims, 3 Drawing Sheets

(56) References Cited

U.S. PATENT DOCUMENTS

| | | | | |
|---|---|---|---|---|
| 2020/0135254 | A1 | 4/2020 | Willett | |
| 2024/0205347 | A1 * | 6/2024 | Yoon | H04N 1/2166 |

OTHER PUBLICATIONS

Colless et al., "Dispersive readout of a few-electron double quantum dot with fast rf gate sensors", Physical Review Letters, vol. 110, Jan. 25, 2013, pp. 046805-1-046805-5.

Fedele, Federico et al, "Simultaneous operations in a two-dimensional array of singlet-triplet qubits", Arxiv.org, May 4, 2021, pp. 1-13.

House et al., "High-sensitivity charge detection with a single-lead quantum dot for scalable quantum computation", Physical Review Applied, vol. 6, Oct. 25, 2016, pp. 044016-1-044016-6.

Likharev, Konstantin K. et al., "Single-electron devices and their applications", Proceedings of the IEEE, vol. 87, Issue 4, as early as Apr. 1, 1999, pp. 606-632.

Molotkov et al., "Single-electron computing: Quantum dot logic gates", Journal of Experimental and Theoretical Physics, vol. 83, No. 4, Oct. 1, 1996, pp. 794-802.

Petta et al., "Coherent Manipulation of Coupled Electron Spins in Semiconductor Quantum Dots", Science, vol. 309, Issue 5744, Sep. 30, 2005, pp. 2180-2184.

Reilly et al., "Fast single-charge sensing with a rf quantum point contact", Applied Physics Letters, vol. 91, Oct. 15, 2007, pp. 162101-3-162101-3.

Schoelkopf et al., The Radio-Frequency Single-Electron Transistor (RF-SET): A Fast and Ultrasensitive Electrometer, Science, vol. 280, May 22, 1998, pp. 1238-1242.

Van Wees et al., "Quantized Conductance of Point Contacts in a Two-Dimensional Electron Gas", Physical Review Letters, vol. 60, No. 9, Feb. 29, 1988, pp. 848-850.

Zhang, Yongqiang et al., "A Coplanar XOR Using NANO-NOR-Inverter and Five-Input Majority Voter in Quantum-Dot Cellular Automata Technology", International Journal of Theoretical Physics, vol. 59, No. 2, Dec. 3, 2019, pp. 484-501.

Extended European Search Report from corresponding European Patent Application No. 21191231.6, May 27, 2022.

International Search Report from corresponding PCT Application No. PCT/EP2022/072759, Dec. 16, 2022.

International Preliminary Report on Patentability from corresponding PCT Application No. PCT/EP2022/072759, Nov. 30, 2023.

* cited by examiner

CIRCUIT FOR TRANSPORTING CHARGED PARTICLES

FIELD OF THE DISCLOSURE

The present invention relates to a junction or circuit configured to transport charged particles between a first storage position and a selected or identified storage position of a plurality of storage positions. This junction may e.g., be a T or X junction where one leg is formed by the first storage position and the other 2 or 3 legs, but in principle any number of legs, by the second storage position's.

BACKGROUND

Junctions or circuits of this type may be used in or around quantum processor cores operating below 10K.

Circuits for operation at such low temperatures may be seen in Petta et. al. Science 309, 2180 (2005); see FIG. 5. Other solutions may be seen in US2020/135254.

SUMMARY

In a first aspect, the invention relates to a circuit for transferring charge comprising:

- a first storage element,
- a plurality of second storage elements, and
- a circuit element configured to:
- receive one or more first charged particle(s) from the first storage element,
- receive information identifying one or more of the second storage elements and
- deliver one or more second charged particle(s) to each of the plurality of second storage elements, the second charged particles delivered to the second storage element(s) identified by the information representing the same charge as the first charged particles.

In this context, the charge or charged particles (the number thereof and/or the charge thereof) may represent any type of information, such as the readout results of quantum information from one or more quantum processor cores. Multiple types of quantum processor cores could be used, some of which operate with quantized states of charge, others with quantized states of spin. Often, a resulting spin is converted into a charge for easier and more robust read-out.

Therefore, a need exists of being able to transport charges, typically in the form of discrete numbers (may include zero) of charged particles, to and from quantum processor cores or the like.

In this context, the charge is represented by one or more charged particles, where a charged particle could be an electron or a hole, such as in a semiconductor, an ion or other charged object, such as placed in electrostatic or optical traps. Preferably a single charged particle is provided. Clearly, positively and negatively charged particles will travel in opposite directions when exposed to an electrical field.

In this context, a storage element is configured to receive and hold/store, perhaps only for a brief period of time, one or more charged particles. The storage elements may be identical, based on the same manufacturing method or different from each other. The circuit element may be of the same type as one of or all of the storage elements if desired.

The storage elements and the circuit element may be neighbouring, so that a charge leaving one storage element may travel to the circuit element or vice versa. Alternatively, one or more additional or intermediate storage elements, which may have the same characteristics as the storage elements, may be provided between one or more of the first and second storage elements and the circuit element, so that a charged particle moving from the first or second storage element to the circuit element (or vice versa) moves through the intermediate storage elements. It may be preferred that the intermediate storage elements are positioned more or less along a straight curve/line from the pertaining first or second storage element to the circuit element.

In this context, the received information may be represented in any desired manner. In one situation, the information represents or is in the form of signals, such as voltages, fed to or to be fed to one or more electrodes which, as a result thereof, may generate fields which operate to drive the charged particles in a desired manner, such as from the first storage element to the identified second storage element. Alternatively, or additionally, the information may be represented in other manners. The second storage element may be labelled or numbered, and the information may relate to the number/label of the—or each—second storage element to receive—or not receive—the second charged particles. The information may be provided directly to elements configured to drive or move the charged particles or may be understandable by an element configured to drive such elements. This may be a controller capable of controlling e.g. electrodes. Typically, such elements are configured to provide fields which may drive the particles, such as electrical, magnetic fields or the like.

Figure 5:
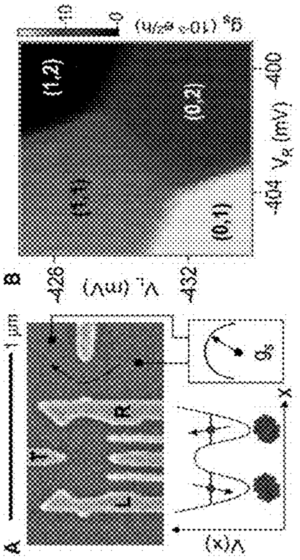

A preferred embodiment of the circuit element, a storage element or each storage element relies on a semiconductor wafer structure with in-plane electron confinement into a planar two-dimensional electron gas (2DEG) at the material interface between a surface layer of higher band gap and the underlying substrate material. Structures of this type may be called a hetero structure. Patterned surface gate electrodes are then used to deplete the 2DEG underneath and form the structure. Furthermore, if the 2DEG structure is additionally depleted by gate electrodes confining the charged particles in all directions, the structure may be called a quantum dot. At low temperatures (below 1 K), the number of electrons in each position or quantum dot can be quantized and may be controlled by the gate electrodes (L and R; see FIG. 5 illustrating two storage elements and means for controlling the movement of charged particles between them) as illustrated in the plot on the right. Note that the charge state of the quantum dot or structure is read-out by a nearby charge sensor with a conductance that reacts sensitively to any relocation of nearby change. In a preferred embodiment, each of the first and second storage elements comprises a quantum dot. Quantum dots are well known and well behaved.

In this context, it may be desired that the storage positions have a low self-capacitance, such that there is a large energy difference (and therefore voltage difference) between the charging events of additional charged particles to the storage position. It may be preferred that only a single charged particle at a time moves between the storage elements in a range of 10-100 mV. This voltage range depends on the strength of the coupling between the storage elements and could be further extended by design. Furthermore, the same method can be used when a small number of charged particles are allowed to move between the storage elements, which would also allow an extension of the voltage range. This voltage or barrier may be determined by selection of the material of the storage element, such as the material storing the charged particle and/or material surrounding this storing material. Alternatively, or additionally, electric/magnetic fields may be provided for defining this barrier.

Usually, the energy required to move the charged particles between the storage elements is very small. At a certain combination of DC voltages fed to electrodes, all energy levels are aligned and charged particles can move freely in either direction. This voltage scale is typically in the V range.

A plurality of second storage elements is provided. Two storage elements may suffice, but more may be provided, such as 3, 4, 5, 6, 8 or more second storage elements.

The circuit element is configured to receive the charged particle(s) from the first storage element. In this context, the circuit element and first storage element may be positioned, in relation to each other, so that the particle may travel from one to the other. This position may be with a small distance there between and/or one or more transport means may be provided for guiding the particle during this trip. Below are manners described of controlling the movement of the particle.

The circuit element may comprise storage elements for transporting the particles from the first storage element to the identified second storage element(s) or it may comprise means, such as electrodes, for transporting the particles directly from the first storage element to the identified second storage element(s).

The circuit element may provide the charge in the selected second storage element in each of two manners. In one manner, the actual charge, such as the charged particles, is/are transferred to the pertaining second storage element. In another embodiment, a corresponding charge is generated in or fed to the second storage element. If multiple second storage elements are provided, the latter strategy is more suitable.

It may be desired that the charge passing the circuit element, or the charge of the first storage element and each identified second storage element, is preserved or is the same, such as if the charge represents a state. In some situations, two states may be provided. One state may relate to there being no charged particles or where the number of charged particles is below a first threshold limit. Another state may be that charged particle(s) is/are present or that the number of charged particles present is above the first threshold limit or a higher, second limit. Then, the preservation or equality of the charge may be desired to maintain the state in question. It is not, however, always required that the charge is represented by the same particle(s).

Often, it is desired to transfer the charge/particle(s) to only one, identified, second storage position. The charge/particle may be transferred to any of the plurality of second storage positions. Thus, one of the second storage elements may be identified, where after the charge/particle(s) is transferred to that element.

In one situation, the circuit element is configured to generate the second charged particle(s) in the second storage position. This may be obtained by copying the charge, such as the number of charged particles, into the pertaining second storage element. In this situation, the charge and particle(s) originally received by the circuit element may be retained or even forwarded to another second storage element or may be removed, such as transferred to a reservoir.

Clearly, this manner of "copying" charge may be also or alternatively be used between the first storage element and the circuit element. Manners of obtaining this "copying function" are described below.

In another situation, the circuit element is configured to transfer the first charged particle(s) to the second storage element as the second charged particle(s). The circuit element thus could be configured to receive one or more first charged particle(s) from the first storage location and deliver the one or more first charged particle(s) to the second storage location.

Clearly, the circuit element may be configured to, a number of times, receive particle(s) from the first storage element, receive information identifying a second storage element and deliver the particles or charge to the identified storage element, where two different steps identify different second storage elements. Preferably, the receiving comprises receiving all particle(s) in a single step and the delivering step comprises delivering all particles or charge to the second storage element. Sequences of particles or charges may then be received, sequentially, by the first storage element and, for each particle(s)/charge in the sequence, a second storage element may be identified, and the delivering may take place accordingly, before or at the same time as the first storage element receives the next particle(s)/charge in the sequence.

In one embodiment, the circuit further comprises one or more first field generating means operable to transfer the charged particle(s) from the first storage element to the circuit element and/or the second storage element(s). A field generating means may be one or more electrodes positioned so as to generate an electrical field directed along a direction between the circuit element/second storage element(s) and the first storage element. The direction of the field may be adapted to a charge of the charged particle(s). The direction of the field may be determined as a direction between the electrodes if provided, such as a direction between centres of the electrodes. Clearly, the direction of the field needs not be directly from one of the circuit element to the first storage element. Even if the field is directed up to 80-90 degrees from this direction, charge transport will be seen, even though an angle of 30 degrees or less is preferred. Such field generating means could then operate in accordance with the identity of the information.

In that or another embodiment, the circuit further comprises one or more second field generating means operable to transfer the charged particle(s) from the circuit element to a, preferably each, second storage element. Individual second field generating means may be provided for individual second storage elements so that one second field generating means may be operated to effect transport of charged particle(s) to the pertaining second storage element, while the remaining second field generating means may not be operated or may be operated in a manner to not detrimentally affect the particle transport.

Clearly, if a desired path of the charged particle is meandering or not straight, the field may be adapted in that regard.

Clearly, the controlling of the movement of the particle(s) may alternative or additionally be controlled by blocking directions in which it is not desired that the particle(s) move(s). For this purpose, one or more blocking means may be provided. Thus, a particle in the circuit element and destined for the first storage element is not desired transported in a direction toward any second storage element. Thus, such directions may be blocked. One manner of blocking a direction is to provide a bias, such as an optical, electrical or magnetic field in an opposite direction, so that a suitable blocking means may comprise magnets, coils, electrodes or the like.

When the elements and particles are very small, tunnelling may be seen, so that the transport of the particle(s) may take this into account. Tunnelling may be used in the actual transport from element to element. When tunnelling is not desired, a blocking means may generate a blocking field sufficiently large as to prevent or seriously hamper tunnelling from the circuit element, for example, to a storage element. It may be desired that the blocking means generates a barrier with a barrier height suppressing tunnelling through the barrier by at least 10%, such as by at least 50%, such as by at least 75%, such as by at least 95%, such as by at least 99.99%, such as by at least 99.999% or even at least by 99.9999%. When blocking with a very high suppression of tunnelling, it may be guarantees that the charges will stay where they are until the blocking is reduced to allow the charges to move.

When the field generating means and any blocking means are not operated, these preferably generate no field or a field so low that the particle(s) may move against the direction defined by the field of the means.

A second aspect of the invention relates to a system comprising a circuit according to the first aspect, the system further comprising a detector or sensor configured to receive the charged particle(s) from one of the second storage positions.

Thus, the circuit may be used for selectively transferring charges from the first storage element to the detector by transferring the particle(s) to the second storage position in or from which the detector may receive and usually detect, such as quantify, the particle(s). The detector may comprise or may sense the charge in the second storage element, or the charge may be moved to an element in which the charge may be detected/sensed.

The detector or sensor may be based on any sensor/detector principle. The charge sensor might be a single electron transistor (SET) [Ave1986], a quantum point contact (QPC) [Wee1988], or a single electron box (SEB) [Lik1999]. These sensors, or any single gate electrode, might be readout in transport or, for a faster readout, by using a radio frequency (RF) signal which may make use of the RF reflectometry sensing techniques [Sch1998, Rei2007, Coll2013, Hou2016], where these references are incorporated by their reference:

[Ave1986] *Coulomb blockade of single-electron tunneling, and coherent oscillations in small tunnel* junctions, D. V. Averin and K. K. Likharev, Journal of Low Temperature Physics 62, 345-373 (1986).

[Wee1988] *Quantized conductance of point contacts in a two-dimensional electron gas*, B. J. van Wees, H. van Houten, C. W. J. Beenakker, J. G. Williamson, L. P. Kouwenhoven, D. van der Marel, and C. T. Foxon, Physical Review Letters 60, 848 (1988).

[Lik1999] *Single-electron devices and their applications*, K. K. Likharev, Proceedings of the IEEE 87, 606-632 (1999).

[Sch1998] *The radio-frequency single-electron transistor (RF-SET): A fast and ultrasensitive electrometer*, R. J. Schoelkopf, P. Wahlgren, A. A. Kozhevnikov, P. Delsing, D. E. Prober, Science 280, 1238-1242 (1998).

[Rei2007] *Fast single-charge sensing with a rf quantum point contact*, D. J. Reilly, C. M. Marcus, M. P. Hanson, and A. C. Gossard, Applied Physics Letters 91, 162101 (2007).

[Coll2013] *Dispersive readout of a few-electron double quantum dot with fast rf gate sensors*, J. I. Colless, A. C. Mahoney, J. M. Hornibrook, A. C. Doherty, H. Lu, A. C. Gossard, and D. J. Reilly, Physical Review Letters 110, 046805 (2013).

[Hou2016] *High-sensitivity charge detection with a single-lead quantum dot for scalable quantum computation*, M. G. House, I. Bartlett, P. Pakkiam, M. Koch, E. Peretz, J. van der Heijden, T. Kobayashi, S. Rogge, and M. Y. Simmons, Physical Review Applied 6, 044016 (2016).

In one embodiment, multiple detectors are provided, such as where an additional detector or sensor is configured to receive the charged particles from another of the second storage elements. Thus, the circuit may be used for controlling to which of the detectors, particles from the first storage element are transferred. This may be used in a number of different manners. Detectors of different types may be selected between, or if charges, to be independently detected/sensed, arrive at the circuit element faster than a detector can detect/sense, a multiplexing scheme may be used where the sequence of charges are fed sequentially to the different detectors.

In general, the circuit may operate as a switch or distributor which may select to which second storage element to forward the charge or particles received.

A third aspect of the invention relates to a circuit comprising:

a first storage element, a plurality of second storage elements, and a circuit element configured to:

receive information identifying one of the second storage elements, receive one or more first charged particle(s) from any one of the plurality of second storage element and deliver one or more second charged particle(s) to the first storage element, the first charged particles of the identified second storage element(s) representing the same charge as the second charged particles.

Basically, this aspect corresponds to the first aspect of the invention where the direction of the charges is reversed.

The circuit element may receive charges from any of the second storage elements but will be capable of receiving charge from the identified second storage element and forward or copy the charge to the first storage element.

Another manner of stating this is: a circuit for transporting charge from any one of a plurality of second storage locations to a first storage location, the circuit comprising a circuit element configured to:

receive one or more charged particle(s) from any one of the plurality of second storage elements (so that any second storage element may be identified)

receive the charged particles of an identified second storage element and deliver one or more second charged particle(s) to the first storage element, the first and second charged particles representing the same charge.

All embodiments, considerations, elements and definitions seen in relation to the above and below aspects of the invention are as relevant in relation to this aspect of the invention.

Again, information is provided or received identifying the second storage element from which the charges are transferred. Multiple second storage elements may comprise charges at any point in time.

Thus, again multiple manners exist of delivering the particle(s) to the first storage element and/or the circuit element. A first manner is the above-mentioned copying wherein the circuit element is configured to generate the second charged particle(s) in the first storage element. In this situation, a similar charge is generated in the first storage element and/or the circuit element. This charge may then be used in the same manner as if the actual particle(s) were transferred.

In another manner, the actual particle(s) is/are transferred from the identified second storage element, via or to the circuit element and further to the first storage element. In this embodiment, the circuit element is configured to receive the first charged particle(s) from the second storage element and deliver the one or more first charged particle(s) to the first second storage element.

Another manner of stating this is that the circuit element is configured to:

receive one or more first charged particle(s) from the second storage element and deliver the one or more first charged particle(s) to first storage element.

Then, the circuit could further comprise one or more first field generating means operable to transfer the first charged particle(s) from the circuit element to the first storage element. Also, if desired, one or more second field generating means could be provided if operable to transfer the first charged particle(s) from a selected one of the plurality of second storage elements to the circuit element.

A second storage element is identified from which charges and/or particles are transferred to the first storage element. If another second storage element also has charge/particles, such charge/particle(s) may be required to wait until that second storage element is identified, or the charge/particle(s) may be removed or discarded, if the pertaining second storage element is not identified when the charge/particle(s) is/are at or in or arrive at or in that second storage element.

A fourth aspect of the invention relates to a system comprising a circuit according to the third aspect of the invention, the system further comprising a particle source configured to feed the charged particle(s) to one of the second storage positions.

Then, the pertaining second storage element may be identified to have the charges transported to the first storage element, so that the particles generated by the particle source are transferred to the first storage element. Actually, an additional particle source could be provided which is configured to feed charged particles to another of the second storage elements. Then, by selecting between the second storage elements, it may be identified from which source, particles are allowed to transfer through the circuit element to the first storage element.

The circuit then may operate as a switch or demultiplexer which may convert parallel flows of charges or particles into a single flow of particles or charges.

In one situation, the sources may not be able to provide the particles or charge in a sequence and with a sufficient frequency, so that multiple sources may be used, the particles/charges from which are then fed to separate second storage elements and then interlaced in the circuit element and fed to the first storage element.

Naturally, the particles/charges may travel through any type of guide, such as a conductor or multiple other storage elements, between the source and the second storage element.

In this context, a particle source may be any type of source, such as a reservoir or a circuit or the like generating or outputting the particles. Preferably, the particle source is configured to, in a single step, output a predetermined number of particles and/or a predetermined charge. A quantum computer core may be a particle source if the state of the quantum computer core is read-out as one or more particles or its state is read-out and converted into one or more particles. Alternatively or additionally, the particles provided to or in the first storage element may be used for any purpose such as feeding to a detector or e.g. feeding to a quantum computer core.

In general, the circuit element and the first and second storage elements each is a separate element configured to hold a predetermined charge. Then, the first storage element, the circuit element and each of the second storage elements may in principle each hold separate charges which are not, at least not to any significant degree, mixed with each other.

Also, in general, the above structure may be described as a circuit element and at least three storage elements where the circuit element is configured to receive one or more charged particles from one or more of the storage elements and to deliver one or more charged particles to another of the storage elements. The same particles may be fed from storage element to circuit element and to storage element, or different particles may be provided to the last storage element while the circuit element retains at least part of the received charged particles.

A fifth aspect of the invention relates to a method of operating the circuit according to the first aspect of the invention, the method comprising:

the information identifying one of the plurality of second storage elements, transferring the first charged particle(s) from the first storage element to or via the circuit element and generating, in the identified second storage element, the second charged particle(s).

The selection/identification may be performed in any desired manner. The selection/identification may be performed by an operator controlling the operation of the circuit, or the selection is performed by a processor or controller. The information may represent the identity in any desired manner, such as a pointer to the desired storage position. Alternatively, the information may be signals to be fed to driving elements configured to the drive the particles to the desired storage position.

The selection may be performed, if by an operator, using any type of user interface, such as a keyboard, touch panel/display or the like.

Often, the selection is controlled by a controller or processor controlling also other portions of a system, such as detectors, sources or the like.

The result of the selection, as represented by the information, is that the charge particle(s) of the first storage element are transferred to the selected/identified second storage element. How this transfer is selected and how it is ensured that the particles actually arrive at the selected second storage element will depend on the manner in which the storage elements are provided and on the manner in which the particle(s) is/are transferred.

If the above fields and/or electrodes are used, suitable electrodes and/or fields may be selected and operated to drive the particle(s) between the elements in question. Also, if blocking elements are used, these may be operated to achieve the particle movement or transfer desired.

The transfer of charged particles may be as described above. The generation of the second charged particle(s) may, as described above, be a transfer of the particles or the generation of the particles in question at the second storage element, such as the providing of such particles from a particle source or reservoir. Instead of transporting a number of charged particles to the selected second storage element, the same number of particles of the same type may be provided in that second storage element.

A sixth aspect of the invention relates to a method of operating the circuit according to the first aspect of the invention, the method comprising:

the information identifying one of the plurality of second storage elements, transferring the first charged particle(s) from the first storage element to the circuit element and transferring the first charged particle(s) from the circuit element to the identified second element.

In this aspect, the particle(s) is/are transferred. Then, the first particle(s) is/are transferred to the second storage element. This may be affected using fields, electrodes or the like to drive the particle(s) from element to element.

Naturally, the method may further comprise the step of detecting the charged particles in the identified second storage element. As described above, the detection may take place while the charged particle(s) is/are in the second, or when the charged particle(s) is/are provided to another element, such as another storage element, such as a storage element of a detector.

As described above, charged particle(s) transferred to or generated in/at a number of second storage elements may be detected, such as using separate detectors. The output of the detectors may be used for any purpose.

This method then may implement the above-mentioned switching or multiplexing where the selection may be made for each of a sequence of particles or groups of particles, where, for each particle or group of particles, a second storage element is selected/identified and the particle(s) transferred or generated accordingly.

The controlling of the selection may also facilitate collection of output from the detector(s) and potentially derive additional information from the output of the detector(s).

A seventh aspect of the invention relates to a method of operating the circuit according to the third aspect of the invention, the method comprising:

the information identifying one of the plurality of second storage elements, transferring the first charged particle(s) from the identified second storage element to or via the circuit element and generating, in the first storage element, the second charged particle(s).

Again, the methods, means, steps, embodiments or the like of all aspects of the invention may be interchanged, so that the selection in this respect may be as described above.

The transferring of the particle(s) may be as described above, as may the generation of the particle(s) in the first storage element.

An eighth aspect of the invention relates to a method of operating the circuit according to the third aspect of the invention, the method comprising:

the information identifying one of the plurality of second storage elements, transferring the first charged particle(s) from the identified second storage element to the circuit element and transferring the first charged particle(s) from the circuit element to the first storage element.

As described above, the transferring of the particle(s) may be performed in any desired manner, such as by using fields/electrodes or the like.

As mentioned above, an additional step may be provided of a particle source feeding the charged particle(s) to the identified second storage element. Multiple particle sources may be provided for feeding particles to separate second storage elements.

As described above, the circuit may then be used for serializing or de-multiplexing particles or groups of particles received from the second storage elements. The particles received in the second storage elements may stem from different sources, such as quantum computer cores, detectors, sensors or the like, and these may be fed sequentially, or in any desired order, into the circuit element and further, directly or generated, to the first storage element, from which these may be utilized in any manner. The particles may be detected/sensed or fed to another circuit, such as a quantum computer core.

When controlling the selection/identification, in general, it is known where the particle(s) travelling through the circuit element stem, whereby the overall particle transport is well defined.

A ninth aspect of the invention relates to a circuit, such as a circuit embodying a Boolean operator, the circuit comprising:

an input storage element configured to receive one or more charged particles, a first operator element comprising:

a first operator storage element, a first source of charged particles configured to feed charged particles to the first operator storage element, a first controlling means configured to control the first source to:

feed a first number of charged particles to the first operator storage element if the input storage element holds fewer charged particles than a first threshold number of charged particles, the first number of particles being at or above a second threshold number of charged particles and feed a second number of charged particles to the first operator storage element if the input storage element holds more charged particles than the first threshold number of charged particles, the second number of particles being below the second threshold number of charged particles.

In this context, the input storage element and operator storage element may be of the same type of storage element as described above. Also, the source may be as described above.

The circuit may embody or be facilitated to perform a Boolean operator in that the number of charged particles in the operator storage element may be taken as a binary value, such as "0" or "1". One binary value may be assumed or determined when the number of particles in the input storage element is at or above the first threshold number. Then, the other binary value may be assumed or determined when the number of particles in the input storage element is below the first threshold number.

Similarly, one binary value may be assumed or determined when the number of particles in the first operator storage element is at or above the second threshold number. Then, the other binary value may be assumed or determined when the number of particles in the first operator storage element is below the second threshold number.

When the same binary value, such as "1", is provided to the situations where the numbers are above the thresholds, the binary operator is a NOT gate, as if the particles in the input storage element exceeds the first threshold (binary 1), the particles in the first operator storage element will be below the pertaining (second) threshold (binary 0).

In this manner, a binary operator is generated which may be used at extremely low temperatures, such as at 10K or below, using components which are already known.

The operation of the circuit is controlled by the first controlling means configured to control the first source to:

- feed a first number of charged particles to the first operator storage element if the input storage element holds fewer charged particles than a first threshold number of charged particles, the first number of particles being at or above a second threshold number of charged particles and
- feed a second number of charged particles to the first operator storage element if the input storage element holds more charged particles than the first threshold number of charged particles, the second number of particles being below the second threshold number of charged particles.

This feeding of charged particles, or the controlling thereof, may be obtained in a number of manners. The source is configured to feed the charged particles but may be prevented from doing so or allowed to do so by the first controlling means.

Clearly, the first operator element may be configured to determine or quantify the number of charged particles in the first storage element and then facilitate the providing of the desired number of particles to the first operator storage element.

It is briefly noted that the charged particles of different storage elements may have different signs, so that electrons may be used in one storage location and holes in another. In that manner, an attraction may be seen, whereby an increased number of charged particles in the input storage element would increase the number of charged particles in the first operator storage element. Thus, corresponding circuits could be made in which the relation is reversed but which otherwise operates in the same manner.

It is preferred that the particles in the input storage element themselves, preferably by their presence alone, affect the flow of particles to the first operator storage element or the number of particles therein.

In one embodiment, the first controlling means is configured to provide a first electrical field at the first operator storage element. This may in itself control the number of charged particles provided in the first operator storage element.

However, it may be desired that the charged particles in the input storage element take part in the controlling, such as when different numbers of charged particles in the input storage element defines different numbers of charged particles in the first operator storage element. This may be obtained by positioning the first operator storage element, relative to the input storage element, so that an electrical field emitted by the charged particles in the input storage element reaches any particles in the first operator storage element.

In one situation, this may be obtained by having first electrical field being selected so that:

- the first electrical field, such as together with the field generated by fewer charged particles than the first threshold number, allows more than the second threshold number of charged particles from the first source to enter the first operator storage element, and
- the first electrical field, such as together with the field generated by more charged particles than the first threshold number, prevents more than the second threshold number of charged particles from the first source from entering the first operator storage element.

Naturally, a number of charged particles will create an overall electrical field which may reach or cover the other position so as to affect the number of charged particles reaching the other position.

When the charged particles have the same polarity, such as if all charged particles are electrons, the charged particles in one storage element will repel charged particles in the other storage element. The more charged particles in one storage element, the larger the field and the larger the repelling—and the less charged particles in the other storage element.

Then, the first field may be directed and tuned to ensure the above functionality.

The first controlling means may in one situation be configured to provide the first electrical field between the first source and the first operator storage element. In this situation, the field may act to drive particles from the source to the first operator storage element, where a field from the charged particles (if any) in the input storage element may counteract such transport. Thus, the more particles in the input storage element, the larger the counteracting, and the fewer particles may be driven by the first field from the source to the first operator storage element.

In that or another situation, the first controlling means is configured to provide the first electrical field between the first operator storage element and the input storage element. In this situation, it may be desired that the first field allows, when no particles are present in the input storage element, that a number of particles, exceeding the second threshold number, travel from the source to the first operator storage element. When more than the first threshold number of particles are present in the input storage element, the first field is not able to allow as many particles, if any, in the first operator storage element. The reason may be that the particles in the first operator storage element generate a field which, combined with the first field at the first operator storage element, affects the flow of particles from the source, such as forces particles in a direction back to the source.

Then, in preferred embodiments, the input storage element and the first operator storage element are positioned at a sufficiently small relative distance so that even a few charged particles in one element generate an electrical field which is sufficiently strong to affect the flow of charged particles into the other element.

In a preferred embodiment, the first controlling means may provide the first electrical field as a field not varying over time, so that the operation of the circuit is controlled by the number of particles, and the field provided by these particles, provided to the first input storage element.

In that context, additional electric fields may be provided for controlling a transport of the charged particles into and potentially also out of the first input storage element and additionally out of the first operator storage element. Such transport may be coordinated over multiple elements in order to e.g. empty one element before that element is provided with other particles. Clearly, the circuit may be used a number of times by sequences of groups of charged particles sequentially fed to the input storage element generating a sequence of groups of charged particles in the first operator storage element and which may be transported out of that element for other purposes.

In this context, it is noted that the first and second thresholds need not be identical. Any threshold may be one, so that the second number of particles, which may be one particle, is fed to the operator storage element when no particles are seen in the input storage element. Any threshold may be 1, 2, 3, 4, 5, 6, 7, 8, 9, 10, 20, 25, 50 or any other integer. The storage elements may be different in many manners and may even be differently tuned, such as by electrodes and electrical fields, so that the boundary between the number of particles in one element defining a low number of particles may differ, event significantly, from the number of particles defining a low number of particles in the other element. Clearly, a smaller number of charged particles may have an electrical field boosted by adding an electrical field in the same direction, if required to e.g. displace or affect a larger number of particles.

The above circuit may be converted from a NOT gate or circuit into a NOTNOT circuit. Such circuits may be used for e.g. copying binary states.

In this context, the circuit further comprises a second operator element comprising:

- a second operator storage element,
- a second source of charged particles configured to feed charged particles to the second operator storage element,
- a second controlling means configured to control the source to:
- feed a third number of charged particles to the second operator storage element if the first operator storage element holds fewer charged particles than the second threshold number of charged particles, the third number of particles being at or above a third threshold number of charged particles and
- feed a fourth number of charged particles to the second operator storage element if the first operator storage element holds more charged particles than the second threshold number of charged particles, the fourth number of particles being below the third threshold number of charged particles.

Then, the relation between the first and second operator storage elements may be as that described between the input storage element and the first operator storage element, with the difference that when the number of particles in the input storage element exceeds the first threshold, the number of particles in the first operator storage element will be below the second threshold with the result that the number of particles in the second operator storage element will exceed the third threshold. Thus, when a particular binary state is defined when the number of particles in an element exceeds the threshold number for that element, the state in the input storage element is seen also in the second operator storage element.

It is noted that as the charges provided in each operator storage element may be provided solely by the pertaining source, the number of particles in the input storage element and the first operator storage element may remain constant and may subsequently be used for other purposes, such as in circuits as described below. Alternatively, such charges may be removed in order to initialize the circuit for another operation.

Clearly, the operation of the second controlling means may be as described above for the first controlling means.

The second and first sources may be one source if desired.

A tenth aspect of the invention relates to a circuit, such as a circuit embodying a multiple-input Boolean operator, the circuit comprising:

- a first input storage element configured to receive one or more charged particles,
- a second input storage element configured to receive one or more charged particles,
- a first operator element comprising:
- a first operator storage element,
- a first source of charged particles configured to feed charged particles to the first operator storage element,
- a first controlling means configured to control the first source to:
- feed a first number of charged particles, the first number of particles being at or above a third threshold number of charged particles, to the first operator storage element if:
- the first input storage element holds fewer charged particles than a first threshold number of charged particles and
- the second input storage element holds fewer charged particles than a second threshold number of charged particles, and
- feed a second number of charged particles, the second number of particles being below the third threshold number of charged particles, to the first operator storage element if:
- the first input storage element holds more charged particles than the first threshold number of charged particles, and/or
- the second input storage element holds more charged particles than the second threshold number of charged particles.

In this context, the input storage elements and the first operator storage element may be of the types described above, as may the source and the controlling means.

In this case, the number of particles in the first operator storage element is determined by the number of particles of both the second and the first input storage element. Again, each of the first operator storage element and the input storage elements have separate threshold numbers which may be but need not be the same.

Again, it may be determined that a number of particles in an element exceeding the threshold number of that element will define a predetermined binary state, such as “1” in all elements.

In that situation, a number of particles exceeding the third threshold is fed to the first operator storage element when the numbers of particles in both input storage elements are below the pertaining thresholds. When the number of particles in one or both input storage elements exceed the pertaining threshold, a number, lower than the third threshold, of particles is fed to the first operator storage element. This embodies a NOR operation or rather a 2-input NOR operation.

Clearly, this circuit may be expanded by a third input storage element or even more input storage elements to arrive at a NOR gate with additional inputs. Then, the controlling means would have to control the particles and the source in correspondence with this, but this will be analogous to what is described.

Clearly, the first controlling means may be embodied in any manner to obtain this functionality. Again, the fields output by the charged particles in the input storage elements may be utilized if desired.

In one embodiment, the first controlling means is configured to provide a first electrical field at the first operator storage element, which first electrical field is selected so that:

- the first electrical field, such as together with the field generated by less charged particles than the first threshold number in the first input storage element and less charged particles than the second threshold number in the second input storage element, allows charged particles, such as more than the third threshold number of charged particles, from the first source to enter the first operator storage element,
- the first electrical field, such as together with the field generated by more charged particles than the first threshold number in the first input storage element, prevents charged particles, such as more than the third threshold number of charged particles, from the first source from entering the first operator storage element and the first electrical field, such as together with the field generated by more charged particles than the second threshold number in the second input storage element, prevents charged particles, such as more than the third threshold number of charged particles, from the first source from entering the first operator storage element.

In this context, the "together with" will be a summing of the electrical fields. This summing often is a vector exercise, as the electrical fields need not have parallel or antiparallel directions.

It may be desired that the first controlling means is configured to provide a first and a second electrical field so that:

the first electrical field together with the field generated by fewer charged particles, in the first input storage element, than the first threshold number allows charged particles from the first source to enter the first operator storage element, and the first electrical field together with the field generated by more charged particles, in the first input storage element, than the first threshold number prevents charged particles from the first source from entering the first operator storage element.

the second electrical field being selected so that:

the second electrical field together with the field generated by fewer charged particles, in the second input storage element, than the second threshold number allows charged particles from the first source to enter the first operator storage element, and the second electrical field together with the field generated by more charged particles, in the second input storage element, than the second threshold number prevents charged particles from the first source from entering the first operator storage element.

In one situation, the first controlling means is configured to provide the first electrical field as:

a second electrical field between the first operator storage element and the first input storage element, a third electrical field between the first operator storage element and the second input storage element and/or a fourth electrical field between the first operator storage element and the first source.

Thus, as described above, the first electrical field, and here also the second/third/fourth electrical field, may be provided in many different positions or combinations of positions. The first/second/third/fourth electrical field preferably is configured and dimensioned to operate in cooperation with an electrical field generated by the particles (if any) in the input storage elements, and even more preferably to be a non-varying field so that the operation of the circuit is defined by the number of particles in the input storage elements.

In the simplest set-up, the first, second, third and fourth electrical field (or which fields are provided) may be formed by a single electrical field such as a single field generated by a single set of electrodes. Naturally, this field may have different field strengths at different positions of the circuit or system.

In general, an electrical field may be a field strength and optionally also a direction.

As described above, additional means and/or fields may be provided for moving particles into and/or out of the elements.

An eleventh aspect of the invention relates to a circuit, such as a circuit embodying a multiple-input Boolean operator, the circuit comprising:

a first input storage element configured to receive one or more charged particles, a second input storage element configured to receive one or more charged particles, a first operator element comprising:

a first operator storage element, a first source of charged particles configured to feed charged particles to the first operator storage element, a first controlling means configured to control the first source to:

feed a second number of charged particles to the first operator storage element if the first input storage element holds more charged particles than a first threshold number of charged particles and the second input storage element holds more charged particles than a second threshold number of charged particles, the second number of particles being below a third threshold number of charged particles and feed a first number of charged particles to the first operator storage element if the first input storage element holds less charged particles than the first threshold number of charged particles and/or the second input storage element holds less charged particles than the second threshold number of charged particles, the first number of particles being at or above the third threshold number of charged particles.

Again, the input storage elements, first operator storage element, the source and controlling means may be as described above.

In this aspect, if a number of particles in an element is seen as a predetermined binary value for all elements when the number of particles exceed the threshold number of that element, this circuit embodies a NAND gate. As mentioned above, additional input storage elements may be provided to arrive at a NAND operation with additional inputs.

Clearly, the number of charged particles fed to the first operator element is below the first threshold number, if the number of particles in each input storage element exceeds the pertaining threshold number. On the other hand, if the number of charged particles in one or both of the input storage elements is below the pertaining threshold number, the number of particles fed to the first operator input element exceeds the first threshold number.

Then, all above considerations of the operation of the first operator element, any fields generated thereby, the positions and directions of these fields and the like are equally useful in this context.

In one situation, the first controlling means is configured to provide a first electrical field at the first operator storage element, the first electrical field being selected so that:

the first electrical field, such as together with the field generated by more charged particles than the first threshold number in the first input storage element and more charged particles than the second threshold number in the second input storage element, prevents charged particles, such as more than the third threshold number of charged particles, from the first source to enter the first operator storage element, the first electrical field, such as together with the field generated by more charged particles than the first threshold number in the first input storage element, allows charged particles, such as more than the third threshold number of charged particles, from the first source from entering the first operator storage element and the first electrical field, such as together with the field generated by more charged particles than the second threshold number in the second input storage element, allows charged particles, such as more than the third threshold number of charged particles, from the first source from entering the first operator storage element.

It may be desired that the first controlling means generates a first and a second electrical field where the first electrical field is selected so that:

the first electrical field together with the field generated by less charged particles than the first threshold number prevents charged particles from the first source from entering the first operator storage element, and the first electrical field together with the field generated by more charged particles than the first threshold number allows charged particles from the first source to enter the first operator storage element and where the second electrical field being selected so that:

the second electrical field together with the field generated by less charged particles than the first threshold number prevents charged particles from the first source from entering the first operator storage element, and the second electrical field together with the field generated by more charged particles than the first threshold number allows charged particles from the first source to enter the first operator storage element.

In this context, the charged particles will not travel to the operator storage element if prevented by one or both of the fields.

As is also indicated above, the first controlling means may be configured to provide the first electrical field as:

a second electrical field between the first operator storage element and the first input storage element, a third electrical field between the first operator storage element and the second input storage element and/or a fourth electrical field between the first operator storage element and the first source.

A twelfth aspect of the invention relates to a method of operating the circuit of the ninth aspect, the method comprising the steps of:

the input storage element receiving one or more charged particles, and the first controlling means controlling the first source to:

if the input storage element holds fewer charged particles than a first threshold number of charged particles, feed a first number of charged particles to the first operator storage element, the first number of particles being at or above a second threshold number of charged particles and if the input storage element holds the same or more charged particles than the first threshold number of charged particles, feed a second number of charged particles to the first operator storage element, the second number of particles being below the second threshold number of charged particles.

In general, the second "if" portion may be taken as an "else" in a standard "if" statement in computer programming so that if the first "if" statement is not true, the second one is and then the following operation is performed.

Thus, the considerations for the ninth aspect of the invention are equally valid, so the two elements may have different thresholds, and when the same binary value or state is defined for each element by a number of particles exceeding the pertaining threshold value, the circuit embodies a NOT gate.

Clearly, the operation of the circuit and the controlling means may be as described above.

In one situation, a first electrical field is provided at the first operator storage element, where:

the first electrical field, such as together with the field generated by less charged particles than the first threshold number, allows charged particles, such as more than the second threshold number of charged particles, from the first source to enter the first operator storage element, and the first electrical field, such as together with the field generated by more charged particles than the first threshold number, prevents charged particles, such as more than the second threshold number of charged particles, from the first source from entering the first operator storage element.

In one situation, the first electrical field is provided between the first source and the first operator storage element.

In that or another situation, the first electrical field is provided between the first operator storage element and the input storage element.

As indicated above, further fields or other manners may be employed to move the charged particles into the input storage element and the charged particles out of the first operator storage element.

In one situation, the circuit further comprises a second operator element comprising:

a second operator storage element, a second source of charged particles configured to feed charged particles to the second operator storage element, a second controlling means configured to control the source, the method further comprising the steps of:

the second operator storage element receiving one or more charged particles, and the first controlling means controlling the first source to:

feed a first number of charged particles to the second operator storage element if the first operator storage element holds fewer charged particles than a first threshold number of charged particles, the first number of particles being at or above a second threshold number of charged particles and feed a second number of charged particles to the second operator storage element if the first operator storage element holds more charged particles than the first threshold number of charged particles, the second number of particles being below the second threshold number of charged particles.

As described above, this may have the same operation with the first operator storage element as the first input storage element has with the first operator storage element, so that, when the same binary state or value is provided to situations where the number of charged particles in an element exceeds the threshold value of that element, a NOTNOT operation is achieved. Then, a copying operation may be obtained where the binary state of the first input storage element is copied to the second operator storage element independently of whether the number of charged particles in the input storage element and the second operator storage element may be different due to different threshold values, for example.

Then, the state may be copies so that the particles of the input storage element may be used for one purpose and those of the second operator storage element for another purpose.

A thirteenth aspect of the invention relates to a method of operating the circuit of the tenth aspect of the invention, the method comprising:

the first input storage element receiving one or more charged particles, the second input storage element receiving one or more charged particles, and the first controlling means controlling the first source to:

feed a first number of charged particles to the first operator storage element if the first input storage element holds fewer charged particles than a first threshold number of charged particles and the second input storage element holds fewer charged particles than a second threshold number of charged particles, the first number of particles being at or above a third threshold number of charged particles and feed a second number of charged particles to the first operator storage element if the first input storage element holds more charged particles than the first threshold number of charged particles and/or the second input storage element holds more charged particles than the second threshold number of charged particles, the second number of particles being below the third threshold number of charged particles.

This is described extensively further above. When the same binary state is defined for each element when the number of charged particles exceeds the threshold number for the element, this embodies a NOR gate. As described above, additional input storage elements may be provided if a NOR operation with additional inputs is desired.

In one situation, the first controlling means is configured to provide a first electrical field at the first operator storage element, the first electrical field being selected so that:

the first electrical field, such as together with the field generated by less charged particles than the first threshold number in the first input storage element and less charged particles than the second threshold number in the second input storage element, allows charged particles, such as more than the third threshold number of charged particles, from the first source to enter the first operator storage element, the first electrical field, such as together with the field generated by more charged particles than the first threshold number in the first input storage element, prevents charged particles, such as more than the third threshold number of charged particles, from the first source from entering the first operator storage element and the first electrical field, such as together with the field generated by more charged particles than the second threshold number in the second input storage element, prevents charged particles, such as more than the third threshold number of charged particles, from the first source from entering the first operator storage element.

It may be desired that the first controlling means is configured to provide a first electrical field and a second electrical field, where:

the first electrical field, such as if provided between the first input storage element and the first operator storage element, being selected so that:

the first electrical field together with the field generated by less charged particles than the first threshold number allows charged particles from the first source to enter the first operator storage element, and the first electrical field together with the field generated by more charged particles than the first threshold number prevents charged particles from the first source from entering the first operator storage element, and the second electrical field, such as if provided between the second input storage element and the first operator storage element, being selected so that:

the second electrical field together with the field generated by less charged particles than the first threshold number allows charged particles from the first source to enter the first operator storage element, and the second electrical field together with the field generated by more charged particles than the first threshold number prevents charged particles from the first source from entering the first operator storage element.

A fourteenth aspect of the invention relates to a method of operating the circuit of the eleventh aspect of the invention, the method comprising:

the first controlling means controlling the first source to:

feed a second number of charged particles to the first operator storage element if the first input storage element holds more charged particles than a first threshold number of charged particles and the second input storage element holds more charged particles than a second threshold number of charged particles, the second number of particles being at or below a third threshold number of charged particles and feed a first number of charged particles to the first operator storage element if the first input storage element holds more charged particles than a first threshold number of charged particles and/or the second input storage element holds more charged particles than a second threshold number of charged particles, the first number of particles being at or above the third threshold number of charged particles.

Clearly, the above considerations are equally valid here. This circuit may embody a two-input NAND gate, but additional inputs may be provided if desired.

In one situation, the first controlling provides a first electrical field at the first operator storage element, where the first electrical field being selected so that:

the first electrical field, such as together with the field generated by more charged particles than the first threshold number in the first input storage element and more charged particles than the second threshold number in the second input storage element, prevents charged particles, such as more than the third threshold number of charged particles, from the first source to enter the first operator storage element, the first electrical field, such as together with the field generated by more charged particles than the first threshold number in the first input storage element, allows charged particles, such as more than the third threshold number of charged particles, from the first source from entering the first operator storage element and the first electrical field, such as together with the field generated by more charged particles than the second threshold number in the second input storage element, allows charged particles, such as more than the third threshold number of charged particles, from the first source from entering the first operator storage element.

It may be desired that the first controlling provides a first electrical field between the first input storage element and the first operator storage element, and a second electrical field between the second input storage element and the first operator storage element, where:

the first electrical field being selected so that:

the first electrical field together with the field generated by less charged particles than the first threshold number prevents charged particles from the first source from entering the first operator storage element, and the first electrical field together with the field generated by more charged particles than the first threshold number allows charged particles from the first source to enter the first operator storage element, and the second electrical field being selected so that:

the second electrical field together with the field generated by less charged particles than the first threshold number prevents charged particles from the first source from entering the first operator storage element, and the second electrical field together with the field generated by more charged particles than the first threshold number allows charged particles from the first source to enter the first operator storage element.

In one situation, the first electrical field is provided as:

a second electrical field between the first operator storage element and the first input storage element, a third electrical field between the first operator storage element and the second input storage element and/or a fourth electrical field between the first operator storage element and the first source.

Naturally, the above circuits or gates may be used for a number of purposes. They enable the generation of binary circuits or processors operable even at extremely low temperatures, and they facilitate coordinated or clocked operation in that the transport of charged particles into and out of any storage element may be coordinated to allow e.g. parallel processing of multiple sets of data.

In one aspect of the invention, an analysis circuit is provided using such circuits for analysing or comparing states of qubits, such as when used for error correction of qubits. Arrangements or strategies for qubit error correction are known in which a number of qubits are intended to operate identically. Any difference between two qubits then is seen as an error in one or both qubits, and systems are described for identifying such errors, where the states of the qubits are compared and it is decided which qubit is erroneous and how the error is to be corrected.

The reading-out of a state of a qubit may be performed in many manners. It may be desired that the state of the qubit is not altered in the process, so that the means used or reading-out or representing the state may be desired to not alter this. A useful tool in that respect is the so-called CNOT or conditional NOT gate.

Then, a system according to an aspect of the invention may comprise:

a first qubit and one or more second qubits, each qubit having a state, sensing means configured to provide information relating to the state of each of the first qubit and the second qubit(s), the sensing means being configured to represent each state of the qubits by one or more charged particles, an output storage element and an analysis circuit comprising a plurality of circuits according to any of the above types of circuits, such as the circuits forming binary gates or circuits, the analysis circuit being configured to:

receive the charged particles from the sensing means and if the state of the first qubit has a first relationship to one or more of the second qubits, output a first number of charged particles to the output storage element and otherwise output a second number of charged particles to the output storage.

In this context, a qubit may be a two-level quantum-mechanical system, the basic unit for quantum information. A qubit is configured to represent two states. A qubit may represent a coherent superposition of states and thus can be in an infinite number of possible superposition states. A state of a qubit is, when detected, collapsed into one of two states, such as a "0" or a "1" or a "spin-up" or a "spin-down". Qubits of different types exist. Some qubits operate on a single particle, where other qubits operate using multiple particles. Some qubits encode the quantum information in the number of particles, other qubits in the location of particles, other qubits in the spin of a particle, and other qubits in other properties, such as for instance polarization, phase, quadrature or flux. Some multiple particle qubits, such as singlet-triplet qubits, operate on two particles having opposite spins, where the initialization may be providing one of the particles with a particular spin and the other particle with the opposite spin.

The sensing means may be any known type of detector, sensor or the like able to determine, sense or ascertain a state of a qubit. Some sensing means destroy the state of the qubit when detecting the state, such as if collapsing the wave function (and thus the superposition into one of the two basic values).

Other means do not destroy the state and thus allow the qubit to maintain the state and keep operating based on that state. For example, means are known which compare states of qubits and thus output one signal if the qubits are equal and another if they are not. Some elements will, for example, compare the states of 4 qubits and output one signal if an even number of qubits have the same state(s) and another if an uneven number has the same states. A "conditional not" gate is a type of sensing means that does not alter the state of the qubit.

Naturally, a state of a qubit may be represented by a number of charged particles. In addition or alternatively, a relation between the states of two qubits or more, such as the first qubit and a second qubit, may be represented by a number of charged particles. Thus, if the states are identical or corresponding, one number of charged particles may be provided if the states are identical or corresponding and another number of charged particles may be provided if the states are different or sufficiently different.

The analysis circuit comprises a plurality of the above-mentioned circuits or gates which may be used for comparing charges/states and thus determining whether the state of the first qubit corresponds to, such as identical to, the state of one or more of the second qubits. From this determination, which is known using technologies using standard (room temperature) processors, it is possible to determine whether a predetermined correspondence exists between the first qubit and a second qubit, for example. From the correspondence, it is possible to determine, if required, a manipulation of the first qubit which would bring the correspondence to another predetermined correspondence, such as to bring the state of the first qubit to be more or less identical to the state of the second qubit.

Clearly, if the first and a second qubit do not have the same state, it may be difficult to determine which qubit to manipulate. If multiple second qubits are provided, where all second qubits and the first qubit are e.g. operated identically and intended to have the same state, such as if all qubits receive the same inputs or at least substantially the same inputs, it may be possible to determine whether to manipulate the first qubit or not.

Naturally, any qubit may be the first qubit. Thus, one qubit may be considered a second qubit by one analysis circuit and the first qubit by another analysis circuit.

The analysis circuit outputs a first number of charged particles, such as one or zero charged particles, if the first qubit has a first relationship with one or more of the second qubits. Thus, the first number of charged particles may represent the fact that the first qubit should be manipulated in a particular manner in order to have a state corresponding better or more to the state(s) of the second qubit(s). An element may then be provided which responds to the presence of the charged particle(s) and performs the pertaining manipulation of the first qubit.

A manner of manipulating a qubit using the presence of one or more charged particles may be seen in Applicant's co-pending application filed on even date and with the title "A METHOD OF MANIPULATING A QUBIT AND AN ASSEMBLY COMPRISING A QUBIT" which is hereby incorporated by reference.

Clearly, comparison of states or charges may be performed using a sequence of the gates or circuits.

Another aspect of the invention relates to a method of operating the above system according, the method comprising the steps of:

- representing a state of each of a first qubit and one or more second qubits into a number of charged particles,
- feeding the charged particles to an analysis circuit comprising a plurality of the above-mentioned circuits or gates,
- the analysis circuit outputting to an output storage element:
- a first number of charged particles if the state of the first qubit has a first relationship to one or more of the second qubits
- otherwise a second number of charged particles.

Naturally, the embodiments, means, steps and circuits of the individual aspects of the invention may be exchanged.

In general, it may be desired that the electrical field(s) configured to transport charges between sources and storage elements is/are kept constant and the operation of the gates is handled by moving the charges from storage element to storage element. Thus, the movement of charges into or out of a source is controlled by the presence (and potentially also the number of) of charges. This transport may be handled by other electrical fields or other means and may comprise the turning on/off of an electrical field transporting one or more charges from one storage element to the next storage element. Thus, charge transport between storage elements may be coordinated so that the same gate may be used sequentially and the resulting charge(s) of one gate may be transferred to a next gate for a continued processing or calculation.

FIGURE DESCRIPTION

Figure 2:
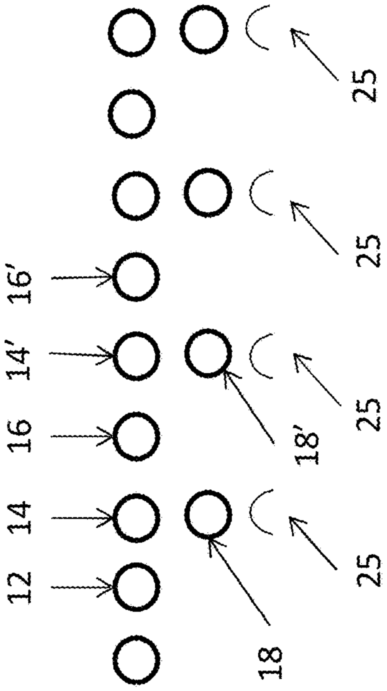
Figure 3:
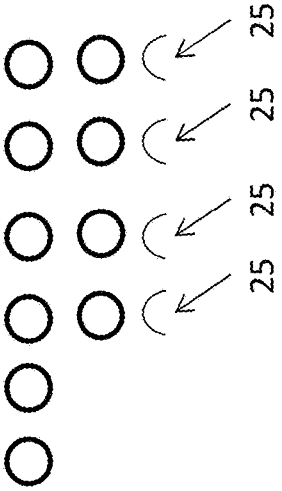
Figure 4:
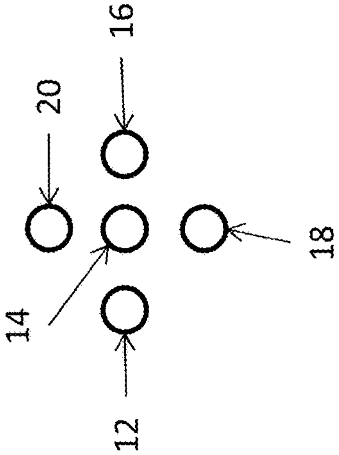
Figure 6:
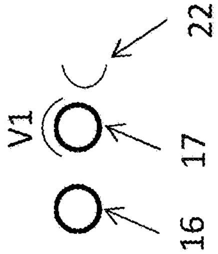
Figure 7:
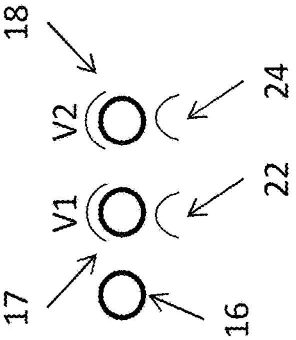
Figure 8:
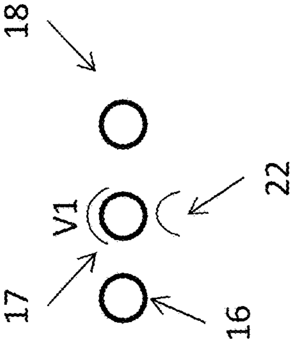
Figure 9:
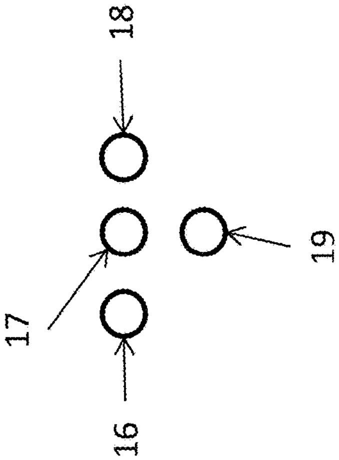
Figure 10:
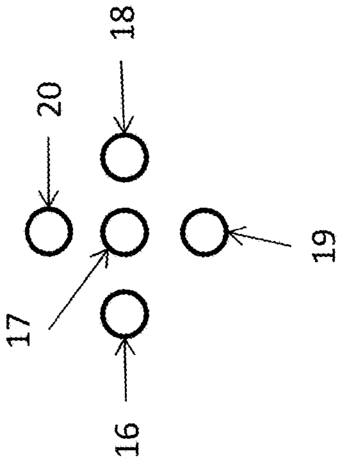
Figure 11:
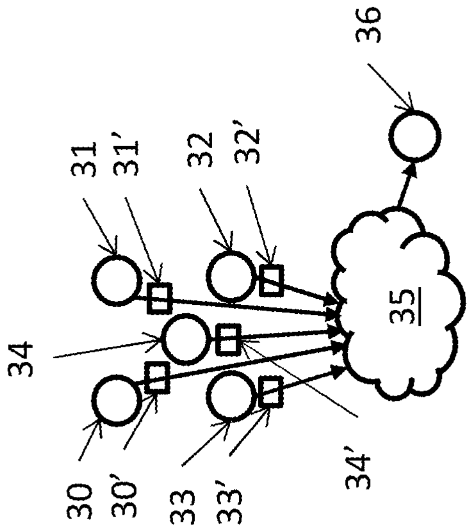

In the following, preferred embodiments of the invention will be described with reference to the drawing, wherein:

FIG. 1 illustrates a system with a T gate and 3 neighbouring positions,

FIG. 2 illustrates a first manner of de-serializing and detecting a sequence of charged particles, FIG. 3 illustrates a second manner of de-serializing and detecting a sequence of charged particles, FIG. 4 illustrates a system with an X gate and 4 neighbouring positions, FIG. 5 illustrates a prior art double quantum dot set-up, FIG. 6 illustrates an embodiment of a logical NOT gate, FIG. 7 illustrates an embodiment of a logical NOTNOT or copy gate, FIG. 8 illustrates an embodiment of a logical NAND or NOR gate, FIG. 9 illustrates a three-input logical gate, FIG. 10 illustrates a four-input logical gate, and FIG. 11 illustrates the use of gates to generate an error correction circuit.

DETAILED DESCRIPTION OF VARIOUS EMBODIMENTS

In FIG. 1, a system 10 comprising a first storage element 12, such as an element receiving a charge stemming from or relating to a qubit, a T gate dot 14, and a first and second readout dots 16 and 18, respectively.

In this context, the storage elements and the circuit element are embodied as dots. Clearly, any other type of storage element and circuit element could equally well be used.

The overall operation of the positions or dots is that one or more charged particles present in dot 12 may be transferred to the position 14 and therefrom to either one of the positions 16 and 18. The transfer of charged particles may be affected using electrodes 17 positioned so as to generate electrical fields driving the charged particles from position to position. In relation to the position 14, electrodes may be provided for driving charged particles to the position 16 and the same or other electrodes may be provided for driving the charged particles to the position 18. Such electrodes may then be selectively operated to drive the charged particle(s) to the desired position. As described further below, the electrodes 17 may be controlled by electronics 23.

The signals for the electrodes will act to transport the charges as desired and will thus identify the second position 16 or 18 selected. This identification thus may be found in the signals themselves.

Alternatively, the identification may be made by the electronics 23 or may be fed to the electronics 23 which will then derive the signals to be fed to the electrodes to obtain the desired particle transport. Clearly, the flow of charged particles may be reversed so that charged particles in any of positions 16 and 18 may be transferred to the position 14 and therefrom to the position 12 or the other of positions 16 and 18.

A set-up of that type may be used in a number of manners.

In one situation, the position 12 receives, in swift succession, groups of one or more charged particles, each group of which is desired detected or quantified separately from the others. Thus, such charged particles may be transferred to a detector. However, if the rate of receipt of the particles is higher than the maximum detection frequency of the detector, multiple detectors are required which are fed with less frequent particles.

In that situation, one or more systems as seen in FIG. 1 may be provided for dividing the sequence of particles (or numbers of particles) into streams comprises particles with a lower frequency.

In one situation, each of the positions 16 and 18 may be capable of feeding received particles to a separate detector 25.

In FIG. 2, the structure of FIG. 1 has been multiplied so that a total of four detectors 25 may be operated. Thus, the position 14 may feed every fourth received charged particle to the position 18 and the others to the position 16, which feeds the particles to the position 14' which feeds every third received charged particle to the position 18' and the rest to the position 16' and so on. Then, each detector 25 receives every fourth charged particle (or group of particles) and thus merely has to handle a quarter of the frequency with which the position 12 receives particles.

Another set-up is illustrated in FIG. 3 which is more compact. This set-up may be operated as described in relation to FIG. 2 where, when the first charged particle arrives above the first detector, this charge is copied downwardly to the dot over the first detector. Then, the charges in the remaining dots are shuttled to the right until the next charge is above the next detector. That charge is then copied down. This goes on until, in this example, four consecutive charges are copied to the four detectors. At this time, the first detector will have completed its detection so that it is able to receive the next (fifth) charge, and so on. Parallel detection takes place also in this example so that the detectors have more time per detection than the clock cycle of the charge shuttling.

Alternatively, another manner may be used in which, the charges are shifted right until an oldest, non-detected charge reaches the last of the sequence of dots. Then, instead of again shifting the charges to the right, the charges (which are now in the dots directly above the dots of the lower row) are shifted downwardly, while a new charge is allowed to enter the leftmost dot in the upper row for sequential shifting to the right.

Now, 4 charges are in each of the lower dots which may then be connected to individual detectors 25 which have four times more time to perform the detection than if each charge was to be detected by the same detector. Naturally, this set-up may be extended to have 5, 8, 10, 12, 16, 32, 64, 128 or more detectors operating in parallel.

Naturally, the flow of charged particles may be reversed so that charged particles from one of the positions 16 or 18 may be fed to the position 14 and from that on to either the position 12 or the other of the positions 18 and 16. Thus, the elements 25 described as particle or charge sensors may be particle or charge sources which may feed charged particles into the positions from which these may be assembled to a single sequence of charged particles. These charged particles may then be fed to a qubit or the surroundings of a qubit to take part in the processing performed by the qubit.

FIG. 4 illustrates an embodiment in which four positions are defined around the position 14, so that the position 14 may receive charged particles from any of positions 12, 16, 18 and 20 and may feed such particles to any of these positions.

It is noted that the voltages or potentials of the gates and dots 15-21 as well as the operation of the detectors may be controlled remotely. In the situation where the qubit, read-out dot, memory dot, the other dots and gates as well as the detectors operate at an extreme, low temperature, these may be controlled by voltages, potentials, signals or the like from circuits at e.g. room temperature.

Electronics 23 is provided for controlling the dots, such as voltages or potentials of electrodes 17 controlling the flow or shuttling of charges. Also, the electronics may receive the output of any detector(s) and/or control such detector(s). The electronics 23 may be cooled to the low temperature at the qubit, may be at room temperature or any temperature between these extreme temperatures. The electronics 23 may be a unitary circuit or multiple circuits. Multiple circuits may be distributed and in communication with each other if desired.

Then, the controlling of the circuits of these figures may be obtained by constantly, intermittently or periodically controlling the storage elements or guiding elements, such as the electrodes 17, to provide the particle transport. This controlling comprises the identification of the storage positions to/from which to transport the charges. This may be controlled by electronics 23, which ultimately could be software controlled. Alternatively, the operation may be periodic so that the controlling and thus the identification may be much simpler, such as in the form of periodic signals fed to each electrode.

In fact, the circuit illustrated in FIGS. 1 and 4 may be used for another purpose: an OR gate. If the dots 16 and 18 are used as inputs to the OR gate, any charges or particles held therein may, simultaneously, be fed to the circuit dot 14 which then, if any of the inputs had a charge, will have a charge. This charge, if any, of the dot 14 may then be fed to the dot 12 as a result of the OR operation. Clearly, a binary state of a dot may be determined, such as with one state being a state in which no charge is present in the dot and another state being a state in which the dot has a charge. It may be desired, especially as charges may be difficult to control in very small dimensions, to alternatively have one state being that a dot has a charge below a predetermined threshold limit and where another state is that the dot has a charge above the first threshold limit or above a second, higher threshold limit.

In FIG. 6, a circuit is illustrated comprising an input position 16 and a second position 17. One or more electrodes or other means V1 are provided for generating a potential difference or field between the positions 16 and 17. In addition, a particle reservoir 22 is provided for adding particles to the position 17.

The operation of this circuit or gate may be to set the potential difference V1 and the reservoir so that a particle (or more particles) may be allowed to travel into the position 17, only if no particle(s) is/are positioned in the position 16. Then, any particle(s) in position 16 may repel any particle(s) present in position 17 back into the reservoir 22—or ensure that no such charges travel from the reservoir 22 into the position 17. Clearly, this gate may be reversed, such as if the particles of position 16 are of opposite polarity of that/those of position 16, where such particles when present in position 17 will attract to "pull" particle(s) from the reservoir 22 to the position 17.

This gate then may be a NOT gate, as it may, for particles of the same polarity, act to provide, in position 17, the opposite state of the state of position 16, where a state of a position is a presence or not of one or more particles.

The gate of FIG. 6 may be expanded on, as seen in FIG. 7, where a second position 18 is provided. The position 18 is connected to its own reservoir 24 (which may be the same as reservoir 22) and means V2 are provided for providing a potential difference or field between the positions 17 and 18.

The position 18 may be operated in the same manner, vis-à-vis position 17, as the position 17 is operated vis-à-vis the position 16. Then, the state of the position 18 is a NOT of the state of position 17 and thus a NOTNOT of the state of position 16. This may be seen as a copy gate, as the same state may now be seen in positions 16 and 18.

Other logical gates may be defined, as seen in FIG. 8. Other logical gates, such as AND, OR, NAND, and XOR require the input of at least two states.

Thus, a structure is defined comprising a first position 16 and a second 18, forming the extreme positions, as well as a circuit position 17 positioned adjacent to the first and second positions. In this manner, an OR gate may be obtained by having suitable means V1 between the position 17 and the positions 16 and 18, respectively, as well as a reservoir 22 connected to the position 17. Then, the reservoir and potential differences or fields may be set so that one or more charged particles may travel from the reservoir to the position 17 only if no charged particles (or very few particles) are present in either of positions 16 and 18. Then, a NOR gate is provided. Providing an OR gate merely means using a NOT gate as that seen in FIG. 6 with the gate 17 of FIG. 7 as the input position.

The gate of FIG. 8 may be converted into a NAND gate by setting the means V1 and the reservoir 22 so that a charged particle is fed to the position 17 unless BOTH positions 16 and 18 comprise charged particles. Then, an AND gate may be obtained using the output in position 17 as the input into a NOT gate as seen in FIG. 6.

In FIG. 9, a T-shaped structure is seen. The lower position 19 may be used as an alternative position to position 18 if, for some reason, it is desired to deviate from the linear structure of FIGS. 6 to 8. Alternatively, the position 19 may be a third input, whereby the state of position 17 could be a NOR or NAND with three state inputs. This structure may also be used as a copy circuit if the positions 16 and 17 operate as a NOT gate as seen in FIG. 6 and where the position 17 and each of the positions 18 and 19 also operate as a NOT gate. Then, the positions 18 and 19 each have the same state as the gate 16.

In FIG. 10, an X-shaped structure is seen, merely for illustrating that any number of positions may be provided around the same circuit position.

Then, as logic gates may be provided in the above manner, local processing of signals is possible. In fact, a large number of such gates or processes may be provided which may then perform rather comprehensive or complex signal treatment and calculations. As mentioned, the Boolean gates may be operated using a static field from electrodes and by the transporting of the charged particles into the input storage element. Thus, the transport of charges to/from input storage element and from the operator storage element(s) may control the operation of the calculation. This transport may be synchronized over more gates or all gates so that a sequence of calculations may be performed, for example. The only signal required to perform such calculation may be that controlling this transport of the charged particles.

It is noted that the above storage positions may be embodied in a number of manners, such as:

- Semiconductor quantum dots, either as described with a 2DEG and depletion gates, but could also be made with a non-conducting semiconductor and accumulation gates, or with self-assembled quantum dots (the material forms geometrical dots).
- Metal dots/islands
- Cooper pair boxes
- Molecules
- Single atoms
- Ion traps The charged particles may be any type of particle or even ionized atoms or molecules.

The storage locations may be dimensioned and positioned so as to allow the particle transport described. Often, this transport is provided by tunnelling. Tunnelling depends on both the height and the width of a potential barrier controlling the flow or transport of particles. The height of the barrier may be controlled using electrodes and the width may be controlled by the design of the storage element and/or electrodes. Preferably, a distance below 100 nm is provided in order to ensure fast enough tunnelling.

In situations where no particle transport is desired, such as between a input storage element and an operator storage element, the distance may be larger, as no tunnelling between them is required. When a capacitive effect is desired between two elements, a relative distance of 10 micrometer may suffice, but a lower distance may be desired, such as 5 micrometer, 2 micrometer or 1 micrometer.

It may be desired to provide electrodes as overlapping gate electrodes, for instance by using aluminium, which can grow a thin native oxide on the electrode. Then, the next electrode could be provided right on top/next to it, without making electrical contact, thereby achieving a very good control over the electrical potential. Naturally, the controlling of the sources and the transport of particles may be performed based on e.g. a controller at room temperature, but it is possible to provide a local processing of signals in order to generate the desired signals for controlling the storage elements, source(s) and/or electrodes or fields so that less or no signals are required transported between cryo temperature and room temperature.

FIG. 11 illustrates a system comprising a first qubit 30 and a number of second qubits 31, 32, 33 and 34. This set-up may be a portion of the qubits of a quantum computer. All qubits are intended to operate in the same manner, so that all qubits receive the same input. However, qubits are easily altered or changed by outside fields and the like, so it is expected, though not desired, that some of the qubits will deviate in state from the state of the others. This deviation is desired determined so that the deviating qubits may be manipulated back to the state of the other qubits.

For this purpose, the qubits may be provided in a desired pattern so that the states of a limited amount of qubits may be compared in order to determine whether one or more of such qubits has the same state as the others or not. Schemes for this is widely known in the art.

Different means and strategies exist for determining the state of a qubit or comparing states of two qubits. In the drawing, means 30', 31', 32', 33', and 34' are provided for determining or comparing the states of the qubits.

More particularly, a matrix of qubits (Q) may be provided (see below), where each qubit may be correct (Qc) or incorrect (Qi). Measurement places (M) may be provided between qubits to compare the states of the neighbouring qubits, where each measurement tells us if an even or odd number of it's neighbouring qubits are the same (Me/Mo):

```
Qc- -Qc- -Qc- -Qc
   Qc-Me-Qc-Mo-Qc
Qc-Me-Qc-Mo-Qi-Mo-Qc
   Qc-Me-Qc-Mo-Qc
Qc- -Qc- -Qc- -Qc
```

The output or result of such determination or comparison is converted into a predetermined number of charged particles, such as for each detector or measurement place, which are then fed to an analysis circuit or network 35, which is generated by a number of circuits as seen in FIGS. 1-10, and which outputs predetermined number of charged particles to an output storage element 36, where the number of charged particles depends on whether the state of the first qubit was or was not identical or similar to the states of the second qubits or whether the state of the first qubit deviated in a particular way from one or more of the second qubits.

The number of charged particles fed to the storage element 36 then describes whether a manipulation of the first qubit is desired or not. Naturally, the number of charged particles in the storage element 36 may also describe or represent a particular type of manipulation of the qubit. Alternatively, multiple storage elements 36 may be provided, one for each type of manipulation, where the number of particles in the individual storage elements describe whether the pertaining manipulation is desired. It is noted that multiple different manipulations may be desired of the first qubit.

Then, the presence of the number of charged particles may trigger a manipulation of the qubit. This manipulation may be performed in any desired manner. Such manipulations are well known—often controlled by signals provided from room temperature equipment.

As mentioned above, Applicant's co-pending application filed on even date and with the title "A METHOD OF MANIPULATING A QUBIT AND AN ASSEMBLY COMPRISING A QUBIT" describes manners of manipulating a qubit based on the presence or not of charged particles. This manipulation may be performed based only on constant signals, often voltages, received from room temperature equipment.

ASPECTS

1. A circuit for transferring charge comprising:

a first storage element, a plurality of second storage elements, and a circuit element configured to:

receive one or more first charged particle(s) from the first storage element and deliver one or more second charged particle(s) to any one of the plurality of second storage elements, the first and second charged particles representing the same charge.

2. A circuit according to aspect 1, wherein the circuit element is configured to transfer the first charged particle(s) to the second storage element as the second charged particle(s).

3. A circuit according to aspect 1, wherein the circuit element is configured to generate the second charged particle(s) in the second storage element.

4. A circuit according to aspect 2, further comprising one or more first field generating means operable to transfer the charged particle(s) from the first storage element to the circuit element.

5. A circuit according to aspect 2 or 4, further comprising one or more second field generating means operable to transfer the charged particle(s) from the circuit element to a selected one of the plurality of second storage elements.

6. A system comprising a circuit according to any of the preceding aspects, further comprising a detector or sensor configured to receive the charged particle(s) from one of the second storage elements.

7. A system according to aspect 6, comprising an additional detector or sensor configured to receive the charged particles from another of the second storage elements.

8. A circuit for transferring charge comprising:

a first storage element, one of a plurality of second storage elements, and a circuit element configured to:

receive one or more first charged particle(s) from any one of the plurality of second storage elements and deliver one or more second charged particle(s) to the first storage element, the first and second charged particles representing the same charge.

9. A circuit according to aspect 8, wherein the circuit element is configured to generate the second charged particle(s) in the first storage element.

10. A circuit according to aspect 8, wherein the circuit element is configured to receive the first charged particle(s) from the second storage element and deliver the one or more first charged particle(s) to the first second storage element.

11. A circuit according to aspect 10, further comprising one or more first field generating means operable to transfer the first charged particle(s) from the circuit element to the first storage element.

12. A circuit according to aspect 10 or 11, further comprising one or more second field generating means operable to transfer the first charged particle(s) from a selected one of the plurality of second storage elements to the circuit element.

13. A system comprising a circuit according to aspect 5 or 6, further comprising a particle source configured to feed the charged particle(s) to one of the second storage elements.

14. A system according to aspect 13, comprising an additional particle source configured to feed charged particles to another of the second storage elements.

15. A circuit according to any of the preceding aspects, wherein each of the circuit element and the first and second storage elements is a separate storage element configured to hold a predetermined charge.

16. A method of operating the circuit according to aspect 1, the method comprising: selecting one of the plurality of second storage elements, transferring the first charged particle(s) from the first storage element to the circuit element and generating, in the selected second storage element, the second charged particle(s).

17. A method of operating the circuit according to aspect 1, the method comprising: selecting one of the plurality of second storage elements, transferring the first charged particle(s) from the first storage element to the circuit element and transferring the first charged particle(s) from the circuit element to the selected second storage element.

18. A method according to aspect 16 or 17, further comprising the step of detecting the charged particles in the selected second element.

19. A method of operating the circuit according to aspect 8, the method comprising:

selecting one of the plurality of second storage elements, transferring the first charged particle(s) from the selected second storage element to the circuit element and generating, in the first element, the second charged particle(s).

20. A method of operating the circuit according to aspect 8, the method comprising:

selecting one of the plurality of second storage elements, transferring the first charged particle(s) from the selected second storage element to the circuit element and transferring the first charged particle(s) from the circuit element to the first storage element.

21. A method according to any of aspects 19 and 20, further comprising the step of a particle source feeding the charged particle(s) to the selected second storage element.

22. A circuit comprising:

an input storage element configured to receive one or more charged particles, a first operator element comprising:

a first operator storage element, a first source of charged particles configured to feed charged particles to the first operator storage element, a first controlling means configured to control the first source to:

feed a first number of charged particles to the first operator storage element if the input storage element holds fewer charged particles than a first threshold number of charged particles, the first number of particles being at or above a second threshold number of charged particles and feed a second number of charged particles to the first operator storage element if the input storage element holds more charged particles than the first threshold number of charged particles, the second number of particles being below the second threshold number of charged particles.

23. A circuit according to aspect 22, wherein the first controlling means is configured to provide a first electrical field at the first operator storage element, the first electrical field being selected so that:

the first electrical field, together with the field generated by less charged particles than the first threshold number in the input storage element, allows charged particles from the first source to enter the first operator storage element, the first electrical field, together with the field generated by more charged particles than the first threshold number in the input storage element, prevents charged particles from the first source from entering the first operator storage element.

24. A circuit according to aspect 23, wherein the first controlling means is configured to provide the first electrical field between the first source and the first operator storage element.

25. A circuit according to aspect 23 or 24, wherein the first controlling means is configured to provide the first electrical field between the first operator storage element and the input storage element.

26. A circuit according to any of aspects 22 and 23, further comprising a second operator element comprising:

a second operator storage element, a second source of charged particles configured to feed charged particles to the second operator storage element, a second controlling means configured to control the source to:

feed a third number of charged particles to the second operator storage element if the first operator storage element holds fewer charged particles than the second threshold number of charged particles, the third number of particles being at or above a third threshold number of charged particles and feed a fourth number of charged particles to the second operator storage element if the first operator storage element holds more charged particles than the second threshold number of charged particles, the fourth number of particles being below the third threshold number of charged particles.

27. A circuit comprising:

a first input storage element configured to receive one or more charged particles, a second input storage element configured to receive one or more charged particles, a first operator element comprising:

a first operator storage element, a first source of charged particles configured to feed charged particles to the first operator storage element, a first controlling means configured to control the first source to:

feed a first number of charged particles to the first operator storage element if:

the first input storage element holds fewer charged particles than a first threshold number of charged particles and the second input storage element holds fewer charged particles than a second threshold number of charged particles, the first number of particles being at or above a third threshold number of charged particles and feed a second number of charged particles to the first operator storage element if:

the first input storage element holds more charged particles than the first threshold number of charged particles, or the second input storage element holds more charged particles than the second threshold number of charged particles, the second number of particles being below the third threshold number of charged particles.

28. A circuit according to aspect 27, wherein the first controlling means is configured to provide a first electrical field at the first operator storage element, which first electrical field is selected so that:

the first electrical field, together with the field generated by less charged particles than the first threshold number in the first input storage element and less charged particles than the second threshold number in the second input storage element, allows charged particles from the first source to enter the first operator storage element, the first electrical field, together with the field generated by more charged particles than the first threshold number in the first input storage element, prevents charged particles from the first source from entering the first operator storage element and the first electrical field, together with the field generated by more charged particles than the second threshold number in the second input storage element, prevents charged particles from the first source from entering the first operator storage element.

29. A circuit according to aspect 27, wherein the first controlling means is configured to provide the first electrical field as:

a second electrical field between the first operator storage element and the first input storage element, a third electrical field between the first operator storage element and the second input storage element and/or a fourth electrical field between the first operator storage element and the first source.

30. A circuit comprising:

a first input storage element configured to receive one or more charged particles, a second input storage element configured to receive one or more charged particles, a first operator element comprising:

a first operator storage element, a first source of charged particles configured to feed charged particles to the first operator storage element, a first controlling means configured to control the first source to:

feed a second number of charged particles to the first operator storage element if the first input storage element holds more charged particles than a first threshold number of charged particles and the second input storage element holds more charged particles than a second threshold number of charged particles, the second number of particles being below a third threshold number of charged particles and feed a first number of charged particles to the first operator storage element if the first input storage element holds less charged particles than the first threshold number of charged particles and/or the second input storage element holds less charged particles than the second threshold number of charged particles, the first number of particles being at or above the third threshold number of charged particles.

31. A circuit according to aspect 30, wherein the first controlling means is configured to provide a first electrical field at the first operator storage element, the first electrical field being selected so that:

the first electrical field prevents charged particles from the first source to enter the first operator storage element, the first electrical field allows charged particles from the first source from entering the first operator storage element and the first electrical field allows charged particles from the first source from entering the first operator storage element.

32. A circuit according to aspect 30, wherein the first controlling means is configured to provide the first electrical field as:

a second electrical field between the first operator storage element and the first input storage element, a third electrical field between the first operator storage element and the second input storage element and/or a fourth electrical field between the first operator storage element and the first source.

33. A method of operating the circuit of aspect 22, the method comprising the steps of:

the input storage element receiving one or more charged particles, and the first controlling means controlling the first source to:

if the input storage element holds fewer charged particles than a first threshold number of charged particles, feed a first number of charged particles to the first operator storage element, the first number of particles being at or above a second threshold number of charged particles and if the input storage element holds the same or more charged particles than the first threshold number of charged particles, feed a second number of charged particles to the first operator storage element, the second number of particles being below the second threshold number of charged particles.

34. A method according to aspect 33, wherein a first electrical field is provided at the first operator storage element, where:

the first electrical field together with the field generated by less charged particles than the first threshold number allows charged particles from the first source to enter the first operator storage element, and the first electrical field together with the field generated by more charged particles than the first threshold number prevents charged particles from the first source from entering the first operator storage element.

35. A method according to aspect 34, wherein the first electrical field is provided between the first source and the first operator storage element.

36. A method according to aspect 34 or 35, wherein the first electrical field is provided between the first operator storage element and the input storage element.

37. A method according to any of aspects 33 and 34, wherein the circuit further comprises a second operator element comprising:

a second operator storage element, a second source of charged particles configured to feed charged particles to the second operator storage element, a second controlling means configured to control the source, the method further comprising the steps of:

the second operator storage element receiving one or more charged particles, and the first controlling means controlling the first source to:

feed a first number of charged particles to the second operator storage element if the first operator storage element holds fewer charged particles than a first threshold number of charged particles, the first number of particles being at or above a second threshold number of charged particles and feed a second number of charged particles to the second operator storage element if the first operator storage element holds more charged particles than the first threshold number of charged particles, the second number of particles being below the second threshold number of charged particles.

38. A method of operating the circuit of aspect 27, the method comprising:

the first input storage element receiving one or more charged particles, the second input storage element receiving one or more charged particles, and the first controlling means controlling the first source to:

feed a first number of charged particles to the first operator storage element if the first input storage element holds fewer charged particles than a first threshold number of charged particles and the second input storage element holds fewer charged particles than a second threshold number of charged particles, the first number of particles being at or above a third threshold number of charged particles and feed a second number of charged particles to the first operator storage element if the first input storage element holds more charged particles than the first threshold number of charged particles and/or the second input storage element holds more charged particles than the second threshold number of charged particles, the second number of particles being below the third threshold number of charged particles.

39. A method according to aspect 38, wherein the first controlling means is configured to provide a first electrical field at the first operator storage element, the first electrical field being selected so that:

the first electrical field, together with less charged particles than the first threshold number in the first input storage element and with less charged particles than the second threshold number in the second input storage element, allows charged particles from the first source to enter the first operator storage element, the first electrical field, together with more charged particles than the first threshold number in the first input storage element, prevents charged particles from the first source from entering the first operator storage element and the first electrical field, together with more charged particles than the second threshold number in the second input storage element, prevent charged particles from the first source from entering the first operator storage element.

40. A method of operating the circuit of aspect 30, the method comprising:

the first controlling means controlling the first source to:

feed a second number of charged particles to the first operator storage element if the first input storage element holds more charged particles than a first threshold number of charged particles and the second input storage element holds more charged particles than a second threshold number of charged particles, the second number of particles being at or below a third threshold number of charged particles and feed a first number of charged particles to the first operator storage element if the first input storage element holds more charged particles than a first threshold number of charged particles and/or the second input storage element holds more charged particles than a second threshold number of charged particles, the first number of particles being at or above the third threshold number of charged particles.

41. A method according to aspect 40, wherein the first controlling provides a first electrical field at the first operator storage element, where the first electrical field being selected so that:

the first electrical field, together with more charged particles than the first threshold number in the first input storage element and with more charged particles than the second threshold number in the second input storage element, prevents charged particles from the first source to enter the first operator storage element, the first electrical field, together with less charged particles than the first threshold number in the first input storage element, allows charged particles from the first source from entering the first operator storage element and the first electrical field, together with less charged particles than the second threshold number in the second input storage element, allows charged particles from the first source from entering the first operator storage element.

42. A method according to aspect 40, wherein the first electrical field as:

a second electrical field between the first operator storage element and the first input storage element, a third electrical field between the first operator storage element and the second input storage element and/or a fourth electrical field between the first operator storage element and the first source.

43. A system comprising:

a first qubit and one or more second qubits, each qubit having a state, sensing means configured to provide information relating to the state of each of the first qubit and the second qubit(s), the sensing means being configured to represent each state of the qubits by one or more charged particles, an output storage element and an analysis circuit comprising a plurality of circuits according to any of aspects 22-32, the analysis circuit being configured to:

receive the charged particles from the sensing means and if the state of the first qubit has a first relationship to one or more of the second qubits, output a first number of charged particles to the output storage element and otherwise output a second number of charged particles to the output storage.

44. A method of operating the system according to aspect 43, the method comprising the steps of:

representing a state of each of a first qubit and one or more second qubits into a number of charged particles, feeding the charged particles to an analysis circuit comprising a plurality of circuits according to any of aspects 22-32, the analysis circuit outputting to an output storage element:

a first number of charged particles if the state of the first qubit has a first relationship to one or more of the second qubits otherwise a second number of charged particles.

The invention claimed is:

1. A circuit for transferring charge comprising:

a first storage element, a plurality of second storage elements, and a circuit element configured to:

receive one or more first charged particle(s) from the first storage element, receive information identifying one or more of the second storage elements and deliver one or more second charged particle(s) to each of the plurality of second storage elements, the second charged particles delivered to the second storage element(s) identified by the information representing the same charge as the first charged particles.

2. The method of operating the circuit according to claim 1, the method comprising:

the information identifying one of the plurality of second storage elements, transferring the first charged particle(s) from the first storage element to the circuit element and generating, in the identified second storage element, the second charged particle(s).

3. The method of operating the circuit according to claim 1, the method comprising:

the information identifying one of the plurality of second storage elements, transferring the first charged particle(s) from the first storage element to the circuit element and transferring the first charged particle(s) from the circuit element to the identified second storage element.

4. A circuit for transferring charge comprising:

a first storage element, a plurality of second storage elements, and a circuit element configured to:

receive information identifying one of the second storage elements, receive one or more first charged particle(s) from the identified one of the plurality of second storage elements and deliver one or more second charged particle(s) to the first storage element, the first charged particles of the identified second storage element representing the same charge as the second charged particles.

5. A method of operating the circuit according to claim 4, the method comprising:

the information identifying one of the plurality of second storage elements, transferring the first charged particle(s) from the identified second storage element to the circuit element and generating, in the first element, the second charged particle(s).

6. The method of operating the circuit according to claim 4, the method comprising:

the information identifying one of the plurality of second storage elements, transferring the first charged particle(s) from the identified second storage element to the circuit element and transferring the first charged particle(s) from the circuit element to the first storage element.

7. A circuit comprising:

an input storage element configured to receive one or more charged particles, a first operator element comprising:

a first operator storage element, a first source of charged particles configured to feed charged particles to the first operator storage element, a first controlling means configured to control the first source to:

feed a first number of charged particles to the first operator storage element if the input storage element holds fewer charged particles than a first threshold number of charged particles, the first number of particles being at or above a second threshold number of charged particles and feed a second number of charged particles to the first operator storage element if the input storage element holds more charged particles than the first threshold number of charged particles, the second number of particles being below the second threshold number of charged particles.

8. The circuit according to any of claim 7, further comprising a second operator element comprising:

a second operator storage element, a second source of charged particles configured to feed charged particles to the second operator storage element, a second controlling means configured to control the source to:

feed a third number of charged particles to the second operator storage element if the first operator storage element holds fewer charged particles than the second threshold number of charged particles, the third number of particles being at or above a third threshold number of charged particles and feed a fourth number of charged particles to the second operator storage element if the first operator storage element holds more charged particles than the second threshold number of charged particles, the fourth number of particles being below the third threshold number of charged particles.

9. The method of operating the circuit of claim 7, the method comprising the steps of:

the input storage element receiving one or more charged particles, and the first controlling means controlling the first source to:

if the input storage element holds fewer charged particles than a first threshold number of charged particles, feed a first number of charged particles to the first operator storage element, the first number of particles being at or above a second threshold number of charged particles and if the input storage element holds the same or more charged particles than the first threshold number of charged particles, feed a second number of charged particles to the first operator storage element, the second number of particles being below the second threshold number of charged particles.

10. The method according to claim 9, wherein the circuit further comprises a second operator element comprising:

a second operator storage element, a second source of charged particles configured to feed charged particles to the second operator storage element, a second controlling means configured to control the source, the method further comprising the steps of:

the second operator storage element receiving one or more charged particles, and the first controlling means controlling the first source to:

feed a first number of charged particles to the second operator storage element if the first operator storage element holds fewer charged particles than a first threshold number of charged particles, the first number of particles being at or above a second threshold number of charged particles and feed a second number of charged particles to the second operator storage element if the first operator storage element holds more charged particles than the first threshold number of charged particles, the second number of particles being below the second threshold number of charged particles.

11. A system comprising:

a first qubit and one or more second qubits, each qubit having a state, sensing means configured to provide information relating to the state of each of the first qubit and the second qubit(s), the sensing means being configured to represent each state of the qubits by one or more charged particles, an output storage element and an analysis circuit comprising a plurality of circuits according to claim 7, the analysis circuit being configured to:

receive the charged particles from the sensing means and if the state of the first qubit has a first relationship to one or more of the second qubits, output a first number of charged particles to the output storage element and otherwise output a second number of charged particles to the output storage.

12. A circuit comprising:

a first input storage element configured to receive one or more charged particles, a second input storage element configured to receive one or more charged particles, a first operator element comprising:

a first operator storage element, a first source of charged particles configured to feed charged particles to the first operator storage element, a first controlling means configured to control the first source to:

feed a first number of charged particles to the first operator storage element if:

the first input storage element holds fewer charged particles than a first threshold number of charged particles and the second input storage element holds fewer charged particles than a second threshold number of charged particles, the first number of particles being at or above a third threshold number of charged particles and feed a second number of charged particles to the first operator storage element if:

the first input storage element holds more charged particles than the first threshold number of charged particles, or the second input storage element holds more charged particles than the second threshold number of charged particles, the second number of particles being below the third threshold number of charged particles.

13. The method of operating the circuit of claim 12, the method comprising:

the first input storage element receiving one or more charged particles, the second input storage element receiving one or more charged particles, and the first controlling means controlling the first source to:

feed a first number of charged particles to the first operator storage element if the first input storage element holds fewer charged particles than a first threshold number of charged particles and the second input storage element holds fewer charged particles than a second threshold number of charged particles, the first number of particles being at or above a third threshold number of charged particles and feed a second number of charged particles to the first operator storage element if the first input storage element holds more charged particles than the first threshold number of charged particles and/or the second input storage element holds more charged particles than the second threshold number of charged particles, the second number of particles being below the third threshold number of charged particles.

14. A circuit comprising:

a first input storage element configured to receive one or more charged particles, a second input storage element configured to receive one or more charged particles, a first operator element comprising:

a first operator storage element, a first source of charged particles configured to feed charged particles to the first operator storage element, a first controlling means configured to control the first source to:

feed a second number of charged particles to the first operator storage element if the first input storage element holds more charged particles than a first threshold number of charged particles and the second input storage element holds more charged particles than a second threshold number of charged particles, the second number of particles being below a third threshold number of charged particles and feed a first number of charged particles to the first operator storage element if the first input storage element holds less charged particles than the first threshold number of charged particles and/or the second input storage element holds less charged particles than the second threshold number of charged particles, the first number of particles being at or above the third threshold number of charged particles.

15. A method of operating the circuit of claim 14, the method comprising:

the first controlling means controlling the first source to:

feed a second number of charged particles to the first operator storage element if the first input storage element holds more charged particles than a first threshold number of charged particles and the second input storage element holds more charged particles than a second threshold number of charged particles, the second number of particles being at or below a third threshold number of charged particles and feed a first number of charged particles to the first operator storage element if the first input storage element holds more charged particles than a first threshold number of charged particles and/or the second input storage element holds more charged particles than a second threshold number of charged particles, the first number of particles being at or above the third threshold number of charged particles.

* * * * *